(12) United States Patent
Matsuo et al.

(10) Patent No.: US 11,588,296 B2
(45) Date of Patent: Feb. 21, 2023

(54) PACKAGE, LIGHT-EMITTING DEVICE, AND LASER DEVICE

(71) Applicants: NICHIA CORPORATION, Anan (JP); SHINKO ELECTRIC INDUSTRIES CO., LTD., Nagano (JP)

(72) Inventors: Hidenori Matsuo, Hadano (JP); Masaki Omori, Toshima-ku (JP); Wataru Katayama, Nagano (JP); Ryota Mitsui, Kita-ku (JP)

(73) Assignees: NICHIA CORPORATION, Anan (JP); SHINKO ELECTRIC INDUSTRIES CO., LTD., Nagano (JP)

( * ) Notice: Subject to any disclaimer, the term of this patent is extended or adjusted under 35 U.S.C. 154(b) by 254 days.

(21) Appl. No.: 17/130,723

(22) Filed: Dec. 22, 2020

(65) Prior Publication Data

US 2021/0203127 A1 Jul. 1, 2021

(30) Foreign Application Priority Data

Dec. 27, 2019 (JP) .............................. JP2019-238086

(51) Int. Cl.
*H01S 5/02216* (2021.01)
*H01S 5/024* (2006.01)
*H01S 5/0237* (2021.01)

(52) U.S. Cl.
CPC ........ *H01S 5/02216* (2013.01); *H01S 5/0237* (2021.01); *H01S 5/02469* (2013.01)

(58) Field of Classification Search
None
See application file for complete search history.

(56) References Cited

U.S. PATENT DOCUMENTS

| 2008/0137700 | A1* | 6/2008 | Yamamoto | H01S 5/02212 438/26 |
| 2012/0033696 | A1* | 2/2012 | Hayashi | H01S 5/02235 372/43.01 |
| 2014/0241388 | A1* | 8/2014 | Yamanaka | H01S 5/02224 372/43.01 |
| 2017/0338628 | A1 | 11/2017 | Matsushita et al. | |
| 2019/0013442 | A1 | 1/2019 | Morita et al. | |

(Continued)

FOREIGN PATENT DOCUMENTS

| JP | 2004-247458 A | 9/2004 |
| JP | 2015-142014 A | 8/2015 |
| JP | 2015-159221 A | 9/2015 |

(Continued)

*Primary Examiner* — Tuan N Nguyen
(74) *Attorney, Agent, or Firm* — Foley & Lardner LLP (57) ABSTRACT

A package for at least one laser diode includes: leads configured to be electrically connected to the at least one laser diode; a base including a mounting surface on which the at least one laser diode is to be mounted and a lateral wall located around the mounting surface so as to surround the at least one laser diode, the lateral wall defining first through-holes and including a light-transmissive part configured to transmit a laser beam emitted from the at least one laser diode; and a lead holding member bonded to the lateral wall of the base and defining second through-holes. The leads are disposed through the first through-holes and the second through-holes. At least a central portion of each of the leads is made of copper.

15 Claims, 5 Drawing Sheets

(56) References Cited

U.S. PATENT DOCUMENTS

2019/0123509 A1   4/2019   Hashimoto et al.

FOREIGN PATENT DOCUMENTS

| JP | 2017-085142 A | 5/2017 |
| JP | 2017-208484 A | 11/2017 |
| JP | 2018-107160 A | 7/2018 |
| JP | 2019-016784 A | 1/2019 |
| JP | 2019-079847 A | 5/2019 |
| WO | WO-2015/030093 A1 | 3/2015 |

* cited by examiner

PACKAGE, LIGHT-EMITTING DEVICE, AND LASER DEVICE

CROSS REFERENCE TO RELATED APPLICATION

This application claims priority to Japanese Patent Application No. 2019-238086, filed on Dec. 27, 2019, the entire contents of which are hereby incorporated by reference.

BACKGROUND

The present disclosure relates to a package, a light-emitting device, and a laser device.

A high-power laser beam is used to perform machining processes, such as cutting, boring and marking, on a wide variety of materials, and to weld metal materials. In recent years, with the increase in the output power of a semiconductor laser element (laser diode), it has been considered to use a light-emitting device including a laser diode as a high-power laser device for machining materials. Such a light-emitting device includes a package housing a laser diode, and can be used in various applications such as a projector or an illumination light source, as well as machining applications.

Japanese Patent Publication No. 2019-016784 describes an example of a configuration of a package housing a light-emitting element such as a laser diode.

SUMMARY

There is a demand for a package that is adapted for increase in the output power of a laser diode.

A package according to one embodiment of the present disclosure is a package for at least one laser diode, and includes: leads configured to be electrically connected to the at least one laser diode; a base including a mounting surface on which the at least one laser diode is to be mounted and a lateral wall located around the mounting surface so as to surround the at least one laser diode, the lateral wall defining first through-holes and including a light-transmissive part configured to transmit a laser beam emitted from the at least one laser diode; and a lead holding member bonded to the lateral wall of the base and defining second through-holes. The leads are disposed through the first through-holes and the second through-holes. At least a central portion of each of the leads is made of copper.

According to the present disclosure, it is possible to realize a package that is adapted for increase of the output power of a laser diode.

DETAILED DESCRIPTION

Certain embodiments of the present disclosure will be described in detail below with reference to the drawings. The same reference signs in multiple drawings denote the same or similar parts.

Moreover, the description below is intended to give a concrete form to the technical ideas of the present disclosure, but the scope of the present disclosure is not intended to be limited thereto. The size, material, shape, relative arrangement, etc., of the components are intended as examples, and the scope of the present disclosure is not intended to be limited thereto. The size, arrangement relationship, etc., of the members shown in each drawing may be exaggerated in order to facilitate understanding.

Embodiments

Referring to FIG. 1A to FIG. 2D, an example of a basic configuration of an embodiment of the present disclosure will be described.

Figure 1A:
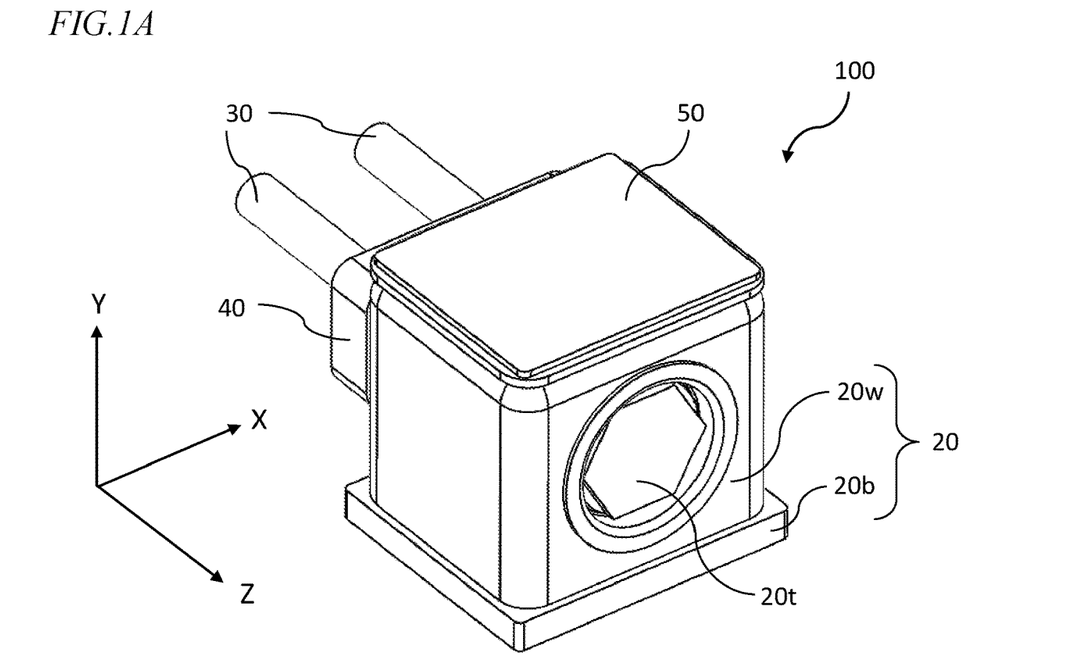
FIG. 1A is a front-side perspective view schematically showing a configuration example of a light-emitting device according to an example embodiment of the present disclosure.
Figure 1B:
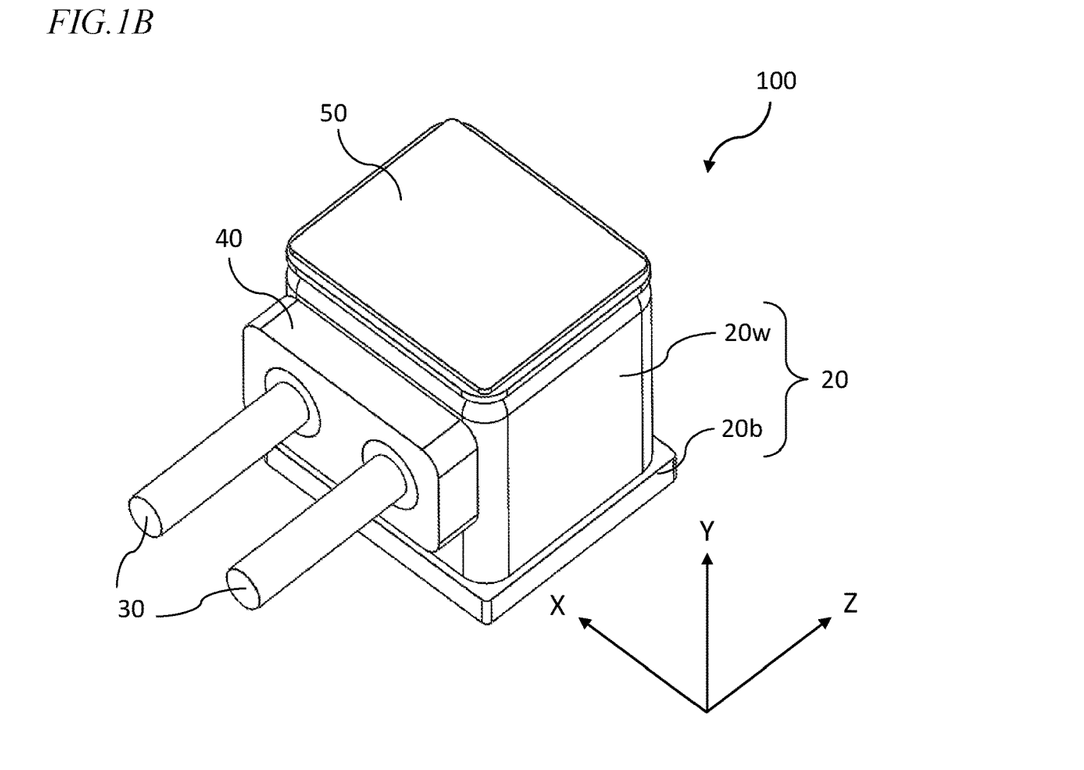
FIG. 1B is a rear-side perspective view schematically showing a configuration example of a light-emitting device according to an example embodiment of the present disclosure.

FIG. 1A and FIG. 1B are a front-side perspective view and a rear-side perspective view, respectively, schematically showing a configuration example of a light-emitting device 100 according to an example embodiment of the present disclosure. These drawings schematically show the X axis, the Y axis and the Z axis, orthogonal to each other, for reference. For ease of understanding, in the present specification, the direction indicated by the arrow of the Y axis will be referred to as "up/upward". This is not intended to limit the orientation in which the light-emitting device 100 is used, and the light-emitting device 100 can be used in any appropriate orientation.

The light-emitting device 100 according to the present embodiment includes a laser diode, and a package housing the laser diode. The laser diode is not externally visible in FIG. 1A and FIG. 13, and is housed in the package.

The package includes a base 20, a pair of leads 30 for supplying electric power to the laser diode, a lead holding member 40 holding the pair of leads 30, and a cover 50 secured to the base 20. The base 20 of the present embodiment includes a bottom portion 20b that supports the laser diode, and a lateral wall 20w that surrounds the laser diode. The lateral wall 20w includes a light-transmissive part 20t that transmits a laser beam emitted from the laser diode. The light-emitting device 100 is configured to emit a laser beam through the light-transmissive part 20t toward the Z direction. The laser diode is hermetically sealed inside the light-emitting device 100 for reliability. The shorter the wavelength of the laser beam emitted from the laser diode, the greater the need for such hermetic sealing.

The cover 50 has a plate shape in the present embodiment. In the example shown in the drawings, a thickness direction of the cover 50 coincides with the Y direction.

At least a central portion along a central axis of each lead 30 in the present embodiment is made of copper, which has a high electrical conductivity. With this structure, a large electric current can flow through the pair of leads 30 while reducing heat generation. Such configuration is preferable when, for example, using a laser diode whose output power is 10 W or greater.

A portion of the package in the present embodiment other than the pair of leads 30 and the lead holding member 40 has a substantially rectangular parallelepiped shape. With a package having such a shape, in contrast to when a package has a substantially cylindrical shape, it is possible to increase the contact surface when the lower surface of the package is brought into contact with a heatsink (not shown), which allows for increasing the heat radiation effect. The maximum size of the package in the X direction, the Y direction and the Z direction may be, for example, 5 mm or more and 10 mm or less.

Figure 2A:
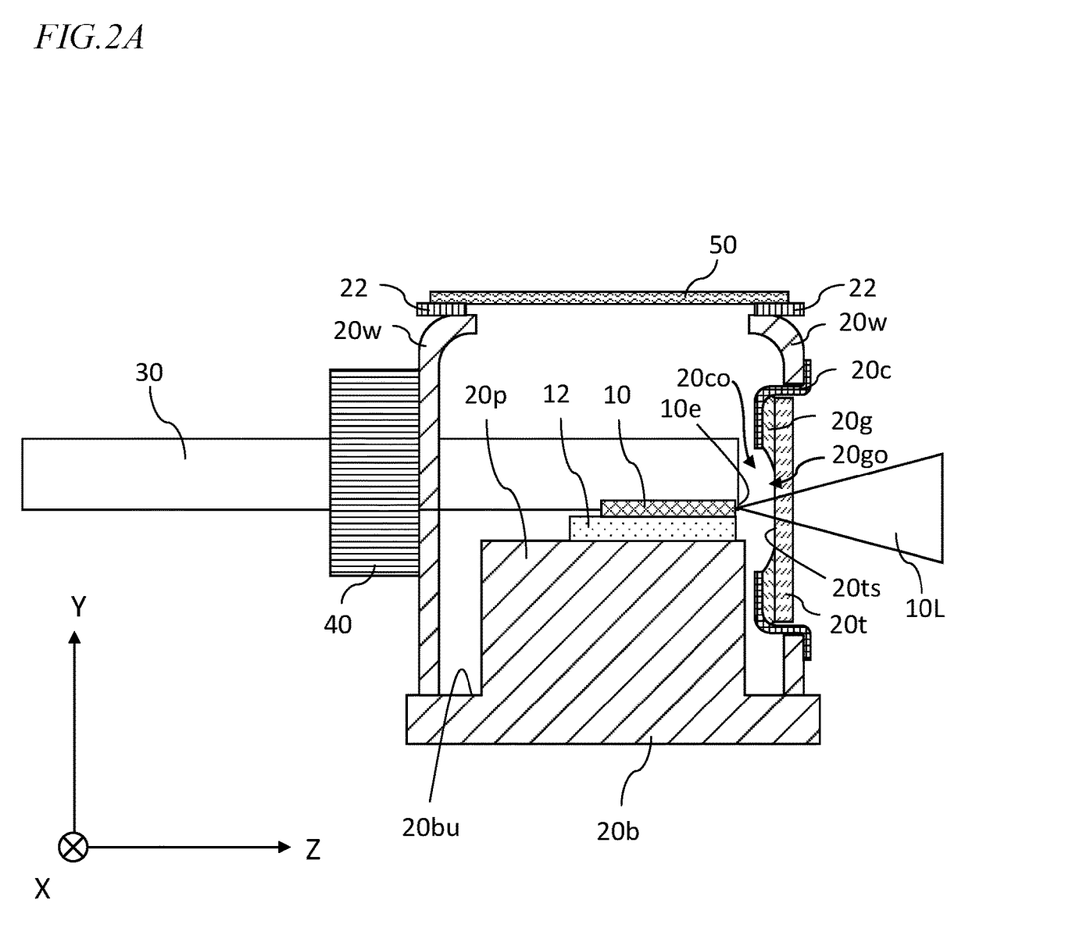
FIG. 2A is a cross-sectional view schematically showing the configuration of FIG. 1A taken along a plane that is parallel to the YZ plane.
Figure 2B:
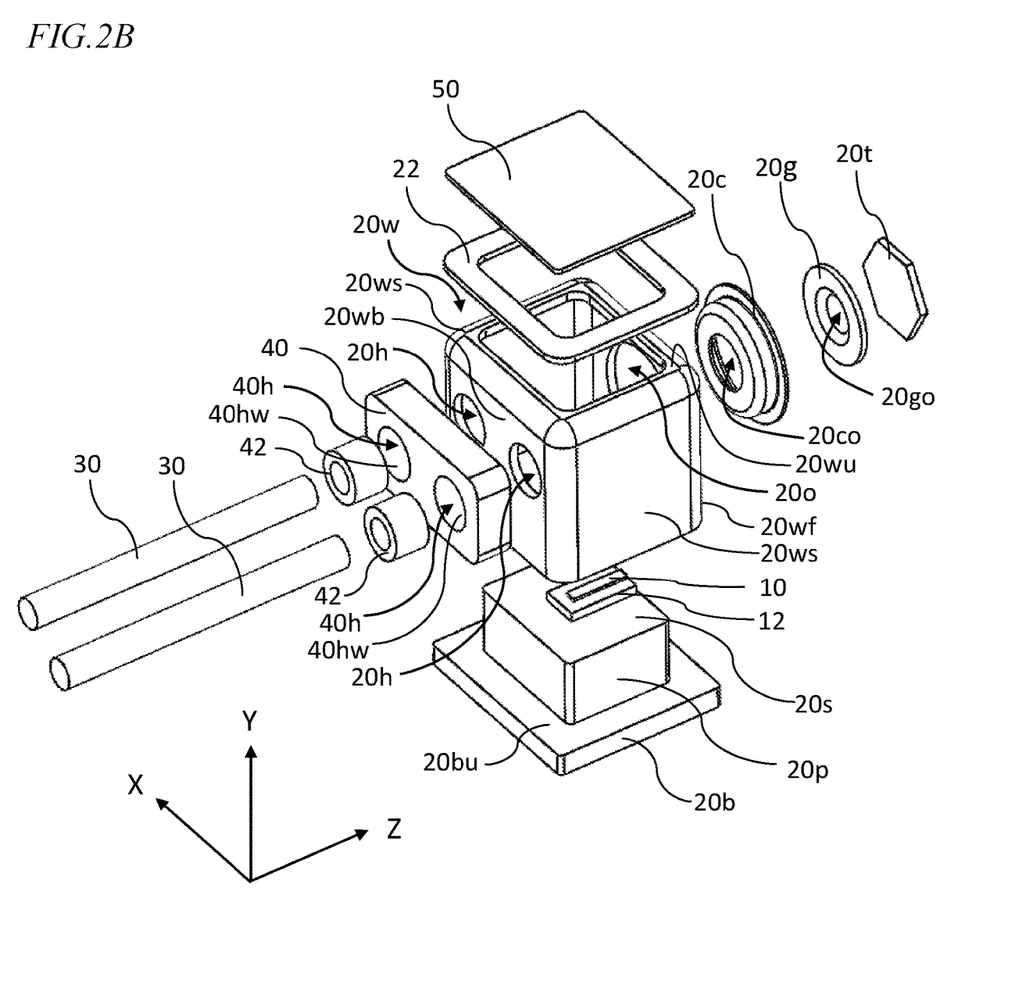
FIG. 2B is a rear-side exploded perspective view schematically showing the configuration of FIG. 1B.
Figure 2C:
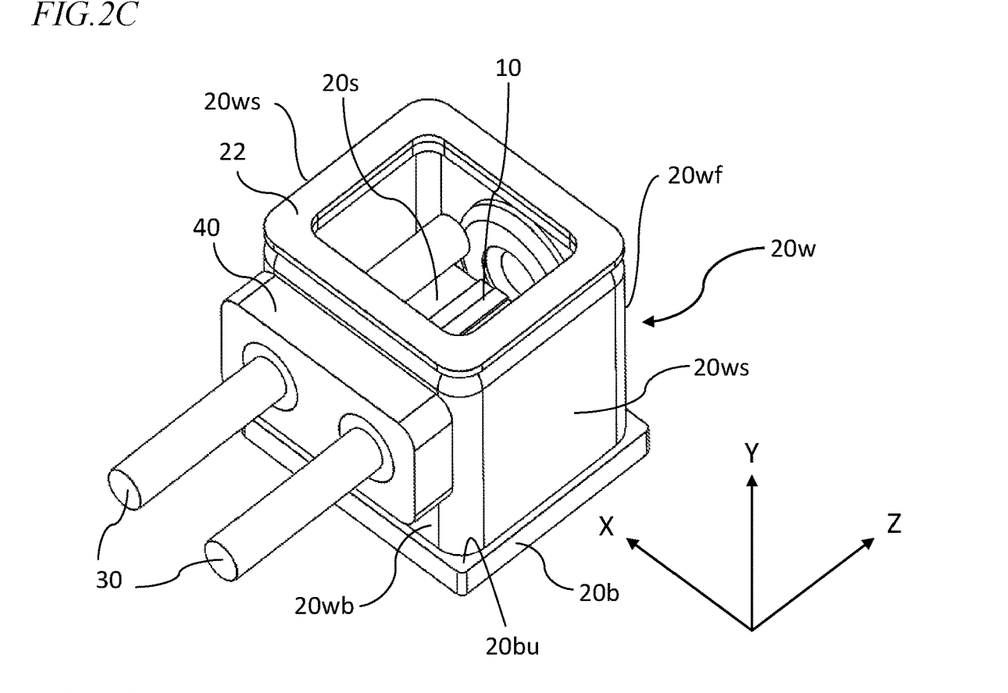
FIG. 2C is a rear-side perspective view schematically showing the configuration of FIG. 1B with the cover removed.
Figure 2D:
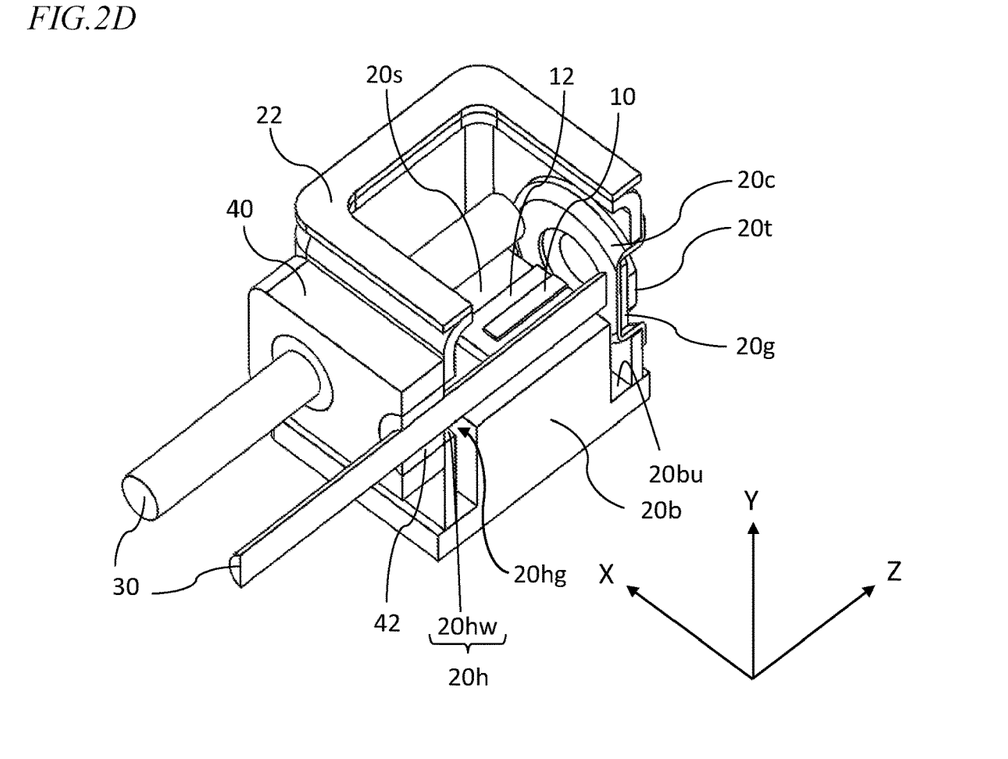
FIG. 2D is a rear-side perspective view schematically showing the configuration of FIG. 2C and showing a cross-section taken along a plane that is parallel to the YZ plane, without illustration of the part at a front side with respect to the plane along which the cross-section is taken.

Referring to FIG. 2A to FIG. 2D, the components of the light-emitting device 100 of the present embodiment will be described below in detail. FIG. 2A is a schematic cross-sectional view of showing the configuration of FIG. 1A taken along the YZ plane. FIG. 2B is a schematic rear-side exploded perspective view showing the configuration of FIG. 1B. FIG. 2C is a schematic rear-side perspective view showing the configuration of FIG. 1B without illustration of the cover 50. FIG. 2D is a rear-side perspective view schematically showing the configuration of FIG. 2C and showing a cross-section taken along a plane that is parallel to the YZ plane, without illustration of the part at a front side with respect to the plane along which the cross-section is taken.

Laser Diode 10

As shown in FIG. 2A, a laser diode 10 is configured to emit laser beam 10L toward the light-transmissive part 20t. The laser beam 10L is a blue, green, or red laser beam in the visible range, or an infrared or ultraviolet laser beam. The laser beam 10L has a divergence, and the divergence angle of the laser beam 10L in the Y direction is larger than the divergence angle in the X direction. The output power of the laser beam 10L may be 10 W or more, for example, but it may be 10 W or less, depending on the application. When the laser diode 10 emits a laser beam 10L of a short wavelength, such as ultraviolet, blue, or green laser beam, hermetically sealing the space in which the laser diode 10 is mounted allows for reducing dust attraction on an emission end surface 10e of the laser diode 10. Also when the laser diode 10 emits a laser beam of a long wavelength, such as red or infrared laser beam, the space in which the laser diode 10 is mounted may be hermetically sealed in view of reliability and durability. While the laser diode 10 is supported indirectly on the bottom portion 20b via a sub-mount 12, the laser diode 10 may be supported directly on the bottom portion 20b of the base 20. While a single laser diode 10 is used in the example herein, two or more laser diodes 10 may be used according to the application. The two or more laser diodes 10 may be arranged along the X direction. The details of the laser diode 10 and the sub-mount 12 will be described below.

Base 20

The bottom portion 20b of the base 20 includes an upper surface 20bu and a protruding portion 20p protruding from the upper surface 20bu, as shown in FIG. 2B. The protruding portion 20p includes a mounting surface 20s on which the laser diode 10 is to be mounted. The mounting surface 20s is a flat surface that is parallel to the XZ plane. The bottom portion 20b having the protruding portion 20p can be formed by pressing, for example. The mounting surface 20s of the protruding portion 20p can be flattened by, for example, polishing or rolling. With adjustment of the height of the protruding portion 20p, the emission end surface 10e of the laser diode 10 and the surface 20ts of the light-transmissive part 20t upon which the laser beam 10L is incident can face each other, as shown in FIG. 2A. With the bottom portion 20b made of, for example, a metal material having a high thermal conductivity, heat generated from the laser diode 10 can be efficiently transmitted to the outside of the light-emitting device 100. For example, copper, iron, a copper alloy or an iron alloy can be used for the metal material.

As shown in FIG. 2C, the lateral wall 20w of the base 20 is located to surround the mounting surface 20s and surrounds the laser diode 10. The lateral wall 20w includes a front surface wall portion 20wf, a back surface wall portion 20wb and two lateral wall portions 20ws. The front surface wall portion 20wf and the back surface wall portion 20wb face each other. The two lateral wall portions 20ws face each other and connect together the front surface wall portion 20wf and the back surface wall portion 20wb. While the lateral wall 20w described above has a substantially angular cylindrical shape, the lateral wall 20w may have a circular cylindrical shape or an elliptical cylindrical shape. The lateral wall 20w may be bonded to an edge portion of the upper surface 20bu of the bottom portion 20b with a bonding material such as silver solder.

The lateral wall 20w of the base 20 includes a pair of through-holes 20h, a cap 20c and an opening 20o, as shown in FIG. 2B. The leads 30 are disposed through the through-holes 20h. The cap 20c holds the light-transmissive part 20t via a first attachment member 20g defining an opening 20go. The cap 20c defines an opening 20co. The cap 20c and the light-transmissive part 20t, which are bonded together with the first attachment member 20g, close the opening 20o formed in the front surface wall portion 20wf of the lateral wall 20w. The light-transmissive part 20t has a plate shape. With the light-transmissive part 20t disposed at the lateral wall 20w via the cap 20c, a thermal stress generated on the lateral wall 20w is unlikely to be transmitted to the light-transmissive part 20t, which allows for preventing damaging or breaking of the light-transmissive part 20t. In the present specification, the cap 20c is referred to also as a "light-transmissive part holding member". While the pair of through-holes 20h is formed in the back surface wall portion 20wb of the lateral wall 20w in the example herein, the through-holes 20h may be formed respectively in the two lateral wall portions 20ws facing each other. The diameter of the through-holes 20h is larger than the diameter of the lead 30. The diameter of the through-holes 20h may be 1 mm or more and 2 mm or less, for example. The edge portion of the cap 20c and the edge portion of the opening 20o of the lateral wall 20w may be bonded together with a bonding material such as a gold tin, for example.

The laser beam 10L emitted from the laser diode 10 passes through the opening 20co of the cap 20c, the opening 20go of the first attachment member 20g, and the light-transmissive part 20t in this order, as shown in FIG. 2A. The distance between the emission end surface 10e of the laser diode 10 and the surface 20ts of the light-transmissive part 20t upon which the laser beam 10L is incident in the Z direction may be 0.2 mm or more and 3 mm or less, for example. The light-transmissive part 20t may have a thickness of 0.1 mm or more and 1 mm or less, for example. The lateral wall 20w may have a thickness of 0.1 mm or more and 0.8 mm or less, for example. The diameter of the opening 20co of the cap 20c may be 1 mm or more and 5 mm or less, for example. The diameter of the opening 20go of the first attachment member 20g may be 1 mm or more and 5 mm or less, for example. Accordingly, the distance between the laser diode 10 and the light-transmissive part 20t is reduced, and thicknesses of the lateral wall 20w and the light-transmissive part 20t are reduced. With this structure, in the package of the present embodiment, a primary portion of the laser beam 10L having a divergence emitted from the laser diode 10 can be efficiently extracted to the outside of the package without being obstructed by a peripheral portion of the light-transmissive part 20t. Thus, in the package of the present embodiment, a thickness of the lateral wall 20w can be reduced, which allows for reducing shielding of the laser beam 10L that may occur due to increase in thickness of the lateral wall 20w.

In the package of the present embodiment, the lateral wall 20w is made of Kovar. Kovar is an alloy in which nickel and cobalt is added to iron, which is the primary component. The thermal expansion of Kovar near room temperature is relatively low among metals, and is close to the thermal expansion coefficient of hard glass. The cap 20c of the present embodiment is made of an Fe—Ni alloy, and the first attachment member 20g is made of a low-melting-point glass. The light-transmissive part 20t is made of a borosilicate glass.

Pair of Leads 30

The pair of leads 30 supply electric power to the laser diode 10 through a wire (not shown).

A first lead 30, the laser diode 10, and a second lead 30 are arranged in this order in a plan view, such that the first lead 30 and the laser diode 10 are electrically connected and the laser diode 10 and the second lead 30 are electrically connected. The pair of leads 30 are made of copper, which has a high electrical conductivity, or an Fe—Ni alloy having a copper core. The copper core is disposed along the central axis of the cylinder shape of the lead. In other words, a tubular Fe—Ni alloy is disposed to surround a cylindrical copper. With the lead 30 including copper, which is a material of a low electric resistance, at the central portion, a large electric current can be flowed through the lead 30. However, when a copper lead is employed, the thermal expansion coefficient of the copper lead is larger than the thermal expansion coefficient of the package lateral wall, so that the sealing performance at the lead-holding portion may be reduced unless the lateral wall has a sufficiently thickness. In the present embodiment, using a lead holding member as will be described below allows for employing a lead having copper while reducing the thickness of the package lateral wall. The diameter of leads 30 is preferably 0.6 mm or more and 2.0 mm or less. In the example shown in the drawings, the pair of leads 30 extend through the pair of through-holes 20h defined in the back surface wall portion 20wb of the lateral wall 20w and are adjacent to each other. When each of the two lateral wall portions 20ws of the lateral wall 20w define through-holes 20h, the pair of leads 30 may pass through their respective through-holes 20h in the two lateral wall portions 20ws and face each other. The pair of leads 30 may be disposed in any appropriate arrangement.

Lead Holding Member 40

As shown in FIG. 2B, the lead holding member 40 has two inner lateral surfaces defining a pair of through-holes 40h respectively, and provided with a pair of second attachment members 42. The leads 30 are disposed through the through-holes 40h. The second attachment members 42 secure the leads 30 to the inner lateral surfaces 40hw defining the through-holes 40h. The lead holding member 40 is bonded to the lateral wall 20w with a bonding material such as silver solder so that the pair of through-holes 40h of the lead holding member 40 are aligned with the pair of through-holes 20h of the lateral wall 20w. Each second attachment member 42 is tightly disposed without leaving a gap between inner lateral surfaces 40hw defining a respective one of the through-holes 40h and a respective one of the leads 30. The lead holding member 40 is made of a soft steel, which is an iron whose carbon content is 0.05% or more and 0.3% or less. The second attachment member 42 is made of a soft glass. A soft steel is a conductive material, and a soft glass is an electrically insulating material. With the second attachment member 42, it is possible to prevent short-circuiting between the pair of leads 30 and improve the sealing property of the package. In the present specification, the through-holes 20h in the lateral wall 20w will be referred to as "first through-holes 20h", and the through-holes 40h in the lead holding member 40 will be referred to as "second through-holes 40h".

As shown in FIG. 2D, there is a gap 20hg between the side wall 20hw defining the first through-hole 20h and the lead 30. That is, the lateral wall 20w and the lead 30 are not in contact with each other. With this structure, the pair of leads 30 will not be short-circuited through the conductive lateral wall 20w.

The gap 20hg is sealed from the outside by the lead holding member 40 bonded to the lateral wall 20w. The lead holding member 40 can stably hold the pair of leads 30. Even when the leads 30 have a diameter of about 2 mm, the leads 30 can be held stably. The lead holding member 40 has a thickness greater than or similar to that of the lateral wall 20w in the Z direction. In other words, in the direction perpendicular to the plane on which the lateral wall 20w and the lead holding member 40 are bonded together, the size of the lead holding member 40 is greater than or equal to that of the lateral wall 20w. With the lead holding member 40 having a thickness greater than or similar to that of the lateral wall 20w, the effect of holding the pair of leads 30 can be improved.

In the package of the present embodiment, the lead holding member 40, instead of the lateral wall 20w, holds the pair of leads 30, and it is therefore possible to reduce the thickness of the lateral wall 20w as described above. In the example shown in the drawing, the pair of leads 30 are disposed adjacent to each other, and accordingly the lead holding member 40 also defines the pair of second through-holes 40h that are adjacent to each other. When the pair of leads 30 face each other as described above, two lead holding members 40, each having a single through-hole 40h, are bonded to the two lateral wall portions 20ws of the lateral wall 20w.

In the package of the present embodiment, the materials of the lateral wall 20w, the lead holding member 40, the second attachment member 42 and the central portion of the lead 30 have thermal expansion coefficients as described below. The thermal expansion coefficient of Kovar is about $5 \times 10^{-6} K^{-1}$, the thermal expansion coefficient of a soft steel is about $11 \times 10^{-6} K^{-1}$, the thermal expansion coefficient of a soft glass is about $9 \times 10^{-6} K^{-1}$, and the thermal expansion coefficient of copper is about $18 \times 10^{-6} K^{-1}$. A portion of each lead 30 other than the central portion of the lead 30 may be made of a material other than copper, so that the thermal expansion coefficient of the lead 30 as a whole may differ from that of copper. In the present embodiment, the thermal expansion coefficient of the lead holding member 40 is approximately in the middle between the thermal expansion coefficient of the lateral wall 20w and thermal expansion coefficient of the lead 30. Thus, the lead holding member 40 functions as a buffer member. Therefore, even when a thermal stress is generated on the lateral wall 20w while using the package of the present embodiment, the gap 20hg between the side wall 20hw defining the first through-hole 20h and the lead 30 can continue to be externally sealed using the lead holding member 40.

In the package of the present embodiment, the thermal expansion coefficient of the lead holding member 40 is greater than or equal to the thermal expansion coefficient of the lateral wall 20w and less than or equal to the thermal expansion coefficient of the lead 30, so that the lead holding member 40 reduces the difference in thermal expansion coefficient between the lateral wall 20w and the central portion of the lead 30. This allows for reducing the thermal stress resistance of the package of the present embodiment.

In contrast to a configuration of the package according to the present embodiment, with a configuration in which the lead holding member 40 is absent and the side wall 20hw defining the first through-holes 20h and the leads 30 are secured together by a bonding material such as a soft glass, when a thickness of the lateral wall 20w is reduced as in the present embodiment, the package may not have a high resistance against the thermal stress that increases as the output power of the laser diode is increased.

Cover 50

As shown in FIG. 2B, the cover 50 is bonded to an upper surface 20wu of the lateral wall 20w by a reinforcement member 22. The cover 50 seals the space in which the laser diode 10 is mounted, together with the base 20 and the lead holding member 40. The reinforcement member 22 allows the light-emitting device 100 to be more securely sealed. In a configuration without a reinforcement member 22, a gap may be generated between the upper surface 20wu of the lateral wall 20w and the cover 50. The cover 50 is made of Kovar. The reinforcement member 22 is made of Kovar. With the cover 50 and a reinforcement member 22 made of the same material as the lateral wall 20w, the thermal stress resistance of the package according to the present embodiment can be improved. The cover 50 may not be provided when it is not necessary to seal the space in which the laser diode 10 is mounted.

The lateral wall 20w, the cap 20c, the first attachment member 20g, the light-transmissive part 20t, the lead holding member 40, the second attachment member 42 and the cover 50 may be made of materials other than those specified above. For example, the lateral wall 20w may be made of cold rolled steel plate, as well as Kovar. The lead holding member 40 may be made of Kovar, as well as a soft steel.

Next, the details of the laser diode 10 and the sub-mount 12 will be described.

Details of Laser Diode 10 and Sub-Mount 12

The laser diode 10 has a rectangular outer shape when viewed from above. A lateral surface of the laser diode 10 that is continuous to one of the two short sides of the rectangular shape serves as the emission end surface 10e for emitting light from the laser diode 10. The area dimension of each of the upper surface and the lower surface of the laser diode 10 is larger than the area dimension of the emission end surface 10e.

The laser diode 10 is configured to emit a blue, green or red laser beam in the visible light range or an infrared or ultraviolet laser beam. The emission peak wavelength of blue light is preferably 420 nm or more and 494 nm or less, and more preferably 440 nm or more and 475 nm or less. Examples of the laser diode 10 configured to emit a blue laser beam include a laser diode 10 that contains a nitride semiconductor. Examples of the nitride semiconductor include GaN, InGaN and AlGaN. The emission peak wavelength of green light is preferably 495 nm or more and 570 nm or less, and more preferably 510 nm or more and 550 nm or less. Examples of the laser diode 10 that emits a green laser beam include a laser diode 10 that contains a nitride semiconductor. Examples of the nitride semiconductor include GaN, InGaN and AlGaN. The emission peak wavelength of red light is preferably 605 nm or more and 750 nm or less, and more preferably 610 nm or more and 700 nm or less. Examples of the laser diode 10 configured to emit a red laser beam include a laser diode 10 that contains an InAlGaP-based semiconductor, a GaInP-based semiconductor, a GaAs-based semiconductor, and an AlGaAs-based semiconductor. For the red light laser diode 10, a laser diode 10 that includes two or more waveguide regions may be used. With a laser diode 10 that includes such a semiconductor, the output power is likely to decrease due to heat as compared with a laser diode 10 that includes a nitride semiconductor. Increase of waveguide regions allows for dispersing heat, so that decrease in the output power of the laser diode 10 can be reduced.

The laser diode 10 is disposed such that a lower surface of the laser diode 10 is in contact with the sub-mount 12. Increase of the contact area between the laser diode 10 and the sub-mount 12 allows heat generated from the laser diode 10 while in operation to be quickly radiated to the sub-mount 12.

The laser diode 10 has a length in the Z direction of 50 μm or more and 4 mm or less, for example, a width in the X direction of 50 μm or more and 500 μm or less, for example, and a height in the Y direction of 20 μm or more and 150 μm or less, for example.

The laser diode 10 has a layered structure including an n-type semiconductor layer, an active layer and a p-type semiconductor layer, for example. When the laser diode 10 emits a high-power laser beam, the laser diode 10 may be disposed in a face-down manner, in which the distance between the active layer and the sub-mount 12 is smaller than the distance between the active layer and the upper surface of the laser diode. In the face-down manner, heat generated from the active layer can be efficiently transmitted to the sub-mount 12. In the example shown in FIG. 2B, an electrode (not shown) is disposed on the sub-mount 12, and is electrically connected to the p-type semiconductor layer of the laser diode 10. This electrode will be referred to as a "p-side electrode". On the other hand, another electrode (not shown) is disposed on the upper surface of the laser diode 10, and is electrically connected to the n-type semiconductor layer of the laser diode 10. This electrode will be referred to as an "n-side electrode". Each of the p-side electrode and the n-side electrode is electrically connected to a respective one of the pair of leads 30 through wires (not shown). When the laser diode 10 is disposed in a face-up manner, in which the distance between the active layer and the sub-mount 12 is greater than the distance between the active layer and the upper surface of the laser diode, the arrangement of the p-side electrode and the n-side electrode is opposite from the arrangement described above.

When a voltage is applied to the p-side electrode and the n-side electrode to cause an electric current of a threshold value or greater to flow, the laser diode 10 emits a laser beam from the emission end surface 10e of the active layer. The laser beam 10L has a divergence, and forms an elliptical far field pattern (hereinafter referred to as "FFP") on a plane that is parallel to the emission end surface 10e. An FFP is a shape or light intensity distribution of the emitted laser beam at a position apart from the emission end surface 10e. Light having an intensity of $1/e^2$ or more relative to the peak intensity value in this light intensity distribution is determined as a "primary portion of light".

The shape of the FFP of the laser beam 10L emitted from the laser diode 10 is an elliptical shape that is longer in the direction of layering of a plurality of semiconductor layers including the active layer than in the direction in which the emission end surface 10e of the active layer extends. A direction in which the emission end surface of the active layer extends is determined as a "horizontal direction of the FFP" and the layering direction is determined as a "vertical direction of the FFP".

Based on the light intensity distribution of the FFP, the angle corresponding to the full width at half maximum of the light intensity distribution is determined as the beam divergence angle of the laser diode 10. The beam divergence angle in the vertical direction of the FFP is determined as the divergence angle in the vertical direction, and the beam divergence angle in the horizontal direction of the FFP is determined as the divergence angle in the horizontal direction.

The sub-mount 12 has an upper surface, a lower surface and lateral surfaces, and has a rectangular parallelepiped shape. The size of the sub-mount 12 is smallest in the up-down direction (the Y direction). The sub-mount 12 may have a shape other than a rectangular parallelepiped shape. The sub-mount 12 can be made of, for example, at least one of silicon nitride, aluminum nitride and silicon carbide.

The sub-mount 12 can serve the function of transmitting the heat generated from the laser diode 10 to the outside. In this case, the thermal conductivity of the sub-mount 12 is preferably higher than the thermal conductivity of the mounting surface 20s of the bottom portion 20b. The sub-mount 12 can also serve the function of adjusting the emission position of the laser diode 10.

The sub-mount 12 may have a length in the Z direction of, for example, 200 μm or more and 4 mm or less a width in the X direction of, for example, 300 μm or more and 4 mm or less, and the height in the Y direction of, for example, 100 μm or more and 500 μm or less.

Laser Device

Figure 3:
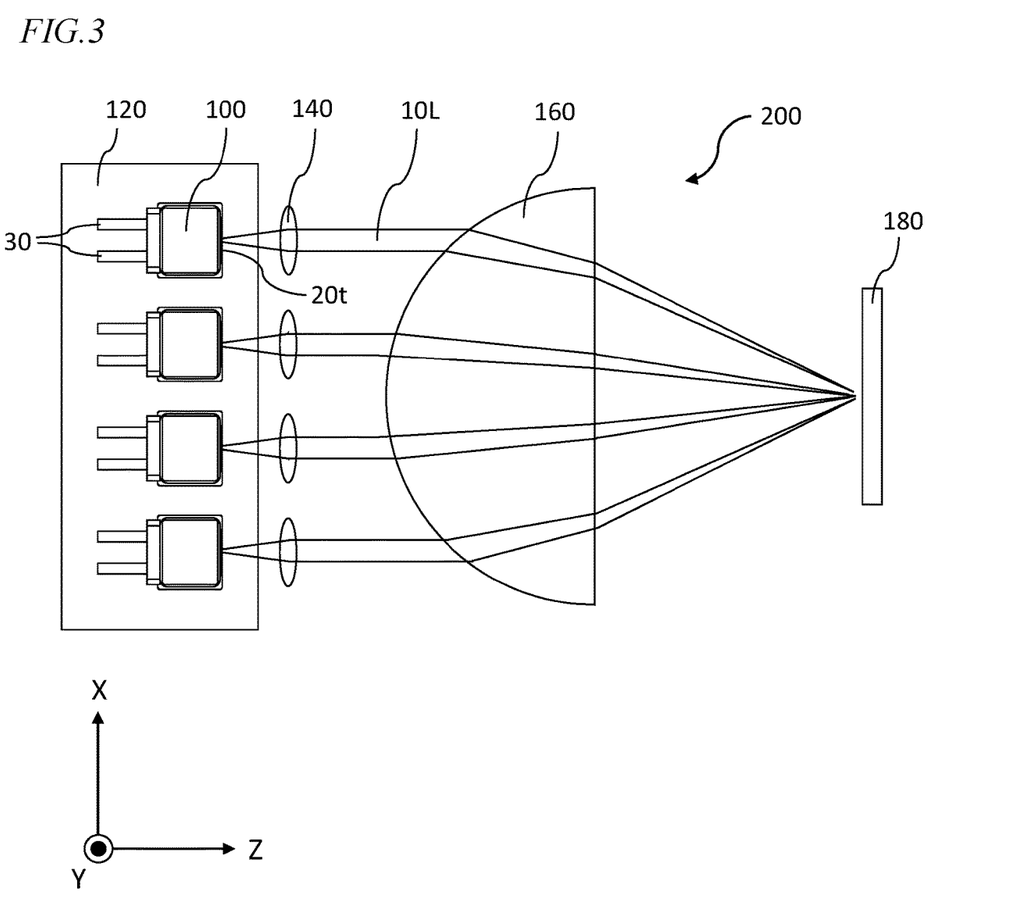
FIG. 3 is a plan view schematically showing a configuration example of a laser device in an application example of the present embodiment.

Next, referring to FIG. 3, a laser device using the light-emitting device 100 of the present embodiment will be described. FIG. 3 is a plan view schematically showing a configuration example of a laser device 200 in an application example of the present embodiment. In the example shown in FIG. 3, the laser device 200 includes a plurality of light-emitting devices 100, a heat dissipation plate 120 that supports the light-emitting devices 100, a plurality of collimate lenses 140, and a condenser lens 160. The light-emitting devices 100 are secured directly to the heat dissipation plate 120 or secured to the heat dissipation plate 120 with grease or solder therebetween. The heat dissipation plate 120 can efficiently transmit the heat generated from the light-emitting devices 100 to the outside. The light-emitting devices 100 are arrayed along the X direction and emit the laser beam 10L toward the Z direction. The light-emitting devices 100 are connected in series. That is, two adjacent leads 30 of two adjacent light-emitting devices 100 are wired together to electrically connect the two adjacent light-emitting devices 100. The collimate lenses 140 are disposed in front of light-transmissive parts 20t of respective light-emitting devices 100. The collimate lenses 140 are collimate lenses configured to collimate laser beams 10L emitted from the light-emitting devices 100. The condenser lens 160 is arranged in front of the light-emitting devices 100 and the collimate lenses 140. The condenser lens 160 condenses a plurality of laser beams 10L that have been collimated, for example. The laser beams 10L that have been collimated may be condensed by an optical system such as a reflecting mirror or a grating instead of the condenser lens 160. A metal plate 180, for example, may be machined with the condensed laser beams 10L. The plurality of laser beams 10L may all have the same wavelength. According to the application, at least one of the plurality of laser beams 10L may have a wavelength different from that of other laser beams 10L of the plurality of laser beams 10L. Alternatively, the laser beams 10L may have mutually different wavelengths. When machining a metal such as copper, it is desirable that the wavelength of the laser beam 10L is in the blue or blue-violet range in order to increase the absorptance of the metal.

The output power of the condensed laser beams 10L is generally equal to the output power of each laser beam 10L times the number of light-emitting devices 100. Increasing the number of light-emitting devices 100 allows for increasing the output power of the laser device 200. The plurality of light-emitting devices 100 may be arrayed not only in the X direction but also in the Y direction to increase the number of light-emitting devices 100.

The laser device 200 in the application example of the present embodiment may be used for a light source of a projector, as well as for metal machining.

A package, a light-emitting device and a laser device of the present disclosure may be used in, for example, metal machining, projectors, etc.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. A package for at least one laser diode, the package comprising:
    a plurality of leads configured to be electrically connected to the at least one laser diode;
    a base comprising:
        a mounting surface on which the at least one laser diode is to be mounted, and
        a lateral wall located around the mounting surface so as to surround the at least one laser diode, the lateral wall defining a plurality of first through-holes and comprising a light-transmissive part configured to transmit a laser beam emitted from the at least one laser diode; and
    a lead holding member bonded to the lateral wall of the base and defining a plurality of second through-holes; wherein:
    each of the leads is disposed through a respective one of the first through-holes and a respectively one of the second through-holes; and
    at least a central portion of each of the leads is made of copper.

2. The package according to claim 1, wherein the lead holding member further comprises a plurality of attachment members, each of which secures a respective one of the leads to an inner lateral surfaces defining a respective one of the second through-holes.

3. The package according to claim 1 wherein a diameter of the leads is 0.6 mm or more and 2.0 mm or less.

4. The package according to claim 1, further comprising a cover that is secured to the lateral wall so as to seal a space in which the laser diode is mounted.

5. The package according to claim 1, wherein a thermal expansion coefficient of the lead holding member is greater than or equal to a thermal expansion coefficient of the lateral wall and less than or equal to a thermal expansion coefficient of the leads.

6. The package according to claim 1, wherein a thickness of the lateral wall is 100 µm or more and 1 mm or less.

7. The package according to claim 1, wherein the lateral wall is made of Kovar or cold rolled steel plate.

8. The package according to claim 1, wherein a size of the lead holding member is greater than or equal to a size of the lateral wall in a direction that is perpendicular to a plane on which the lateral wall and the lead holding member are bonded.

9. The package according to claim 1, wherein the lead holding member is made of a soft steel or Kovar.

10. The package according to claim 1, wherein:
the base comprises a bottom portion that includes the mounting surface; and
the bottom portion is made of copper.

11. The package according to claim 1, wherein:
the lateral wall includes a light-transmissive part holding member that holds the light-transmissive part; and
the light-transmissive part is made of a borosilicate glass.

12. The package according to claim 1, wherein an output power of the laser diode is 10 W or more.

13. The package according to claim 1, further comprising:
a cover that is secured to the lateral wall so as to seal a space in which the laser diode is mounted, wherein:
the lateral wall has a thickness of 100 µm or more and 1000 µm or less;
the lateral wall is made of Kovar;
the lead holding member has a size greater than a size of the lateral wall in a direction that is perpendicular to a plane on which the lateral wall and the lead holding member are bonded;
the lead holding member is made of a soft steel;
the base comprises a bottom portion that includes the mounting surface;
the lateral wall comprises a light-transmissive part holding member that holds the light-transmissive part;
the bottom portion is made of copper; and
the light-transmissive part is made of a borosilicate glass.

14. A light-emitting device comprising:
a package according to claim 1; and
the at least one laser diode mounted on the mounting surface.

15. A laser device comprising:
a plurality of light-emitting devices, each of which is a light-emitting device according to claim 14; and
an optical system configured to condense laser beams emitted from the light-emitting devices.

* * * * *